(12) United States Patent
Lee et al.

(10) Patent No.: US 7,860,357 B2
(45) Date of Patent: Dec. 28, 2010

(54) OPTOELECTRONIC DEVICE CHIP HAVING A COMPOSITE SPACER STRUCTURE AND METHOD MAKING SAME

(75) Inventors: Hsiao-Wen Lee, Hsinchu (TW); Peter Zung, Hsinchu (TW); Tzu-Han Lin, Hsinchu (TW); Tzy-Ying Lin, Hsinchu (TW); Chia-Yang Chang, Jhubei (TW); Chien-Pang Lin, Jhubei (TW)

(73) Assignee: VisEra Technologies Company, Ltd., Hsin-Chu (TW)

( * ) Notice: Subject to any disclaimer, the term of this patent is extended or adjusted under 35 U.S.C. 154(b) by 16 days.

(21) Appl. No.: 12/228,102

(22) Filed: Aug. 9, 2008

(65) Prior Publication Data

US 2008/0303109 A1    Dec. 11, 2008

Related U.S. Application Data

(62) Division of application No. 11/438,128, filed on May 22, 2006, now Pat. No. 7,433,555.

(51) Int. Cl.
    *G02B 6/12* (2006.01)
(52) U.S. Cl. .................................. 385/14; 257/433
(58) Field of Classification Search ............ 385/14; 257/433
    See application file for complete search history.

(56) References Cited

U.S. PATENT DOCUMENTS

| 6,440,773 | B1 * | 8/2002 | Usami ................ 438/107 |
| 6,699,730 | B2 * | 3/2004 | Kim et al. ............ 438/107 |
| 6,777,767 | B2 * | 8/2004 | Badehi ............... 257/432 |
| 7,122,937 | B2 * | 10/2006 | Hatakeyama et al. ..... 310/309 |
| 7,518,223 | B2 * | 4/2009 | Derderian ............ 257/686 |
| 7,524,748 | B2 * | 4/2009 | Fujimoto et al. ........ 438/597 |
| 2003/0022462 | A1 * | 1/2003 | Farnworth et al. ....... 438/455 |
| 2003/0038355 | A1 * | 2/2003 | Derderian ............ 257/686 |
| 2004/0189143 | A1 * | 9/2004 | Hatakeyama et al. ..... 310/309 |
| 2006/0035408 | A1 * | 2/2006 | Derderian ............ 438/106 |
| 2007/0001313 | A1 * | 1/2007 | Fujimoto et al. ........ 257/778 |

FOREIGN PATENT DOCUMENTS

| CN | 00816990.X ZL | 10/2005 |
| CN | 03825610.X ZL | 3/2007 |
| WO | WO2004/070827 A1 | 8/2004 |

* cited by examiner

*Primary Examiner*—K. Cyrus Kianni
(74) *Attorney, Agent, or Firm*—Muncy, Geissler, Olds & Lowe, PLLC

(57) ABSTRACT

An optoelectronic device chip, and a method for making the chip, are disclosed. The chip comprises a device substrate, an optically transparent upper substrate, and a composite spacer layer which includes an adhesive material and a plurality of particles dispersed in said adhesive material. The distance between the device substrate and the upper substrate is controlled by the thickness of the composite spacer layer so that the variation is within the depth of focus of optical system.

7 Claims, 9 Drawing Sheets

OPTOELECTRONIC DEVICE CHIP HAVING A COMPOSITE SPACER STRUCTURE AND METHOD MAKING SAME

This is a divisional of application Ser. No. 11/438,128 filed on May 22, 2006 now U.S. Pat. No. 7,433,555.

BACKGROUND OF THE INVENTION

1. Field of the Invention

This invention relates to an optoelectronic device chip. More particularly, this invention relates to an optoelectronic device chip having a composite spacer structure, and a method for making the optoelectronic device chip having the composite spacer structure.

2. Description of the Related Art

Digital imaging devices have been widely used in many electronic products nowadays. They are used in, for example, digital cameras, digital video recorders, cellular phones with photographing function, safety-control monitors, etc.

A digital imaging device usually includes an optoelectronic device chip, such as a CCD image sensor chip or a CMOS image sensor chip. Such image sensor chips may be packaged by means of an advanced package technology called "wafer-level chip scale package", WLCSP. In traditional package technology, a wafer having micro-devices such as electronic devices, electromechanical devices or optoelectronic devices made thereon is first diced into multiple chips, and thereafter the chips are packaged. However, according to WLCSP, micro-devices such as image sensors may be packaged at their "wafer level" (i.e., when they are still on a wafer).

U.S. Pat. No. 6,777,767 issued to Badehi has disclosed a method for such WLCSP. According to Badehi, as shown in FIG. 1 of the present invention, a package layer is prepared which includes a substrate 400 and multiple spacers 406. The spacers 406 are made of a photoresist material such as an epoxy based photoresist, and patterned by a lithography process to become the structure as shown in the figure.

Referring to FIGS. 2(A)-2(E), adhesive 402 is applied to the package layer adjacent and between the spacers 406, so that the package layer may be bonded with another substrate 404 which is provided with multiple micro-devices thereon. After bonding, the substrate 404 is grinded and etched to become thin separate parts 407, and a cavity 405 is defined between the upper substrate layer 400 and the substrate 404 (FIG. 2(B)). An underlying package layer 410 is adhered to the structure via an epoxy layer 408 (FIG. 2(C)). The package layer 410 and epoxy layer 408 are mechanically notched, and thereafter electrical contacts 412 and bumps 414 are formed thereon (FIG. 2(D)). The resulting assembly is diced along the dash lines to yield a plurality of packaged chips as shown in FIG. 2(E).

In applying the abovementioned WLCSP technology to packaging optoelectronic devices such as digital imaging devices, unlike other electronic devices or electromechanical devices, there is a unique concern—the height of the cavity 405 is very critical to optical characteristics of the devices. In a digital imaging device chip, the height of the cavity 405 is the distance between a cover glass and the focus plane. This distance should be precisely controlled for optimum optical performance. In a digital imaging device chip, the thickness tolerance should be within the range of the depth of focus, which depends on the pixel size and the f/number (FNo) of the optical system associated with the imaging device chip. For example, in an optical system with FNo equal to 2.8, the depth of focus of a 3.6 μm sensor (i.e., pixel size 3.6 μm) is about 10.08 μm; the depth of focus of a 2.2 μm sensor is about 6.16 μm; the depth of focus of a 1.8 μm sensor is about 5.04 μm; the depth of focus of a 1.2 μm sensor is about 3.36 μm.

However, according to Badehi, the height of the cavity 405 is determined by the laminated structure thickness of the spacers 406 and the adhesive 402, while the spacers 406 are formed by a lithography process. Such thick photoresist layer (unlike the photoresist layer used for patterning a semiconductor integrated circuit layer, which is typically in the range of about 1 μm) would result in severe wafer uniformity issue, typically ±(10-20) % thickness variation across the wafer due to spin coating and photoresist viscosity. In other words, there would be ±4 μm to ±8 μm thickness variation for a target spacer thickness of 40 μm. Such a huge difference is unacceptable because it would cause severe defocus issue when the pixel size is smaller than 2.2 μm. As an example, FIG. 7 shows the spot sizes at 46/43/40/37/34 μm, respectively, for a case wherein the pixel size is 1.8 μm and the target thickness is 40 μm. As seen from the figure, the spot sizes at 46 μm and 34 μm have become unacceptably large. The larger the spot size is, the worse the MTF (modulation transfer function) performance is. Therefore, it is necessary to develop a new spacer structure so that the thickness variation is within the thickness tolerance, i.e., the depth of focus, for better optical performance uniformity across the wafer.

In addition to the above drawback, the laminated structure formed by the spacer 406 and the adhesive 402 does not provide enough strength to resist tensile or compressive stress, heat, and shearing force. The process steps after the bonding step of FIG. 2(A) may cause the wafer to crack or delaminate during environmental testing.

Accordingly, for optoelectronic devices such as digital imaging devices, an improved WLCSP method providing more robust spacer structure and more accurate control of the spacer thickness, are required.

SUMMARY OF THE INVENTION

A first object of the present invention is to provide an optoelectronic device chip in which the optical focus is more accurately controlled by a robust composite spacer structure.

A second object of the present invention is to provide a method for making the optoelectronic device chip having the robust composite spacer structure to resist severe environmental testing.

A third object of the present invention is to provide an optoelectronic device chip capable of providing external electrical connection at its upper surface.

To achieve the foregoing objects, the present invention provides an optoelectronic device chip which comprises: a device substrate; an optoelectronic device provided on said device substrate; an upper package layer; and a composite spacer adjacent to said optoelectronic device and connecting said upper package layer with said device substrate, wherein said composite spacer includes an adhesive material and a plurality of particles dispersed in said adhesive material. In a preferred embodiment, the particles are conductive while the adhesive material is insulating, so that the composite spacer is anisotropic conductive.

The present invention also provides a method for making an optoelectronic device chip, which comprises: providing an upper package layer; providing a composite material at predetermined locations on the bottom surface of said upper package layer; providing a device substrate, on which an optoelectronic device has been made; bonding said upper package layer with said device substrate; and transforming said composite material to become a solid structure, wherein said composite material includes an adhesive material and a plurality of particles dispersed in said adhesive material. In a preferred embodiment, the particles are conductive while the adhesive material is insulating, so that the solid structure formed from the composite material is anisotropic conductive.

BRIEF DESCRIPTION OF THE DRAWINGS

The objects, features and advantages of the invention may be better understood within the context of the Description of the Preferred Embodiment, as set forth below, with reference to the accompanying drawings, wherein.

DESCRIPTION OF THE PREFERRED EMBODIMENT

Figure 1:
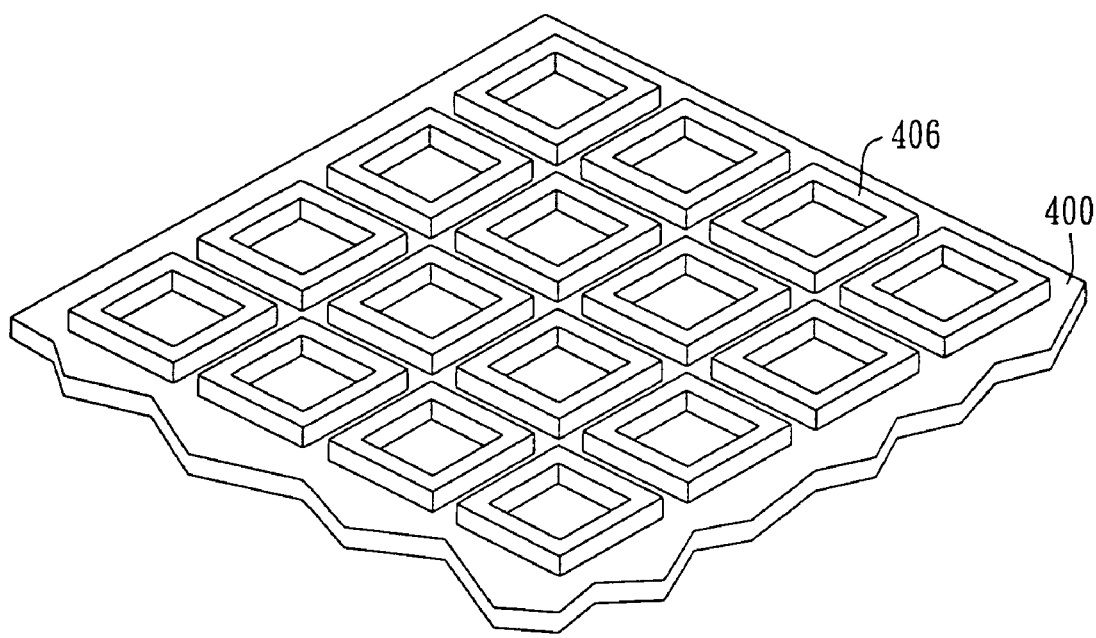
FIG. 1 shows a perspective view of a prior art package layer.
Figure 2A:
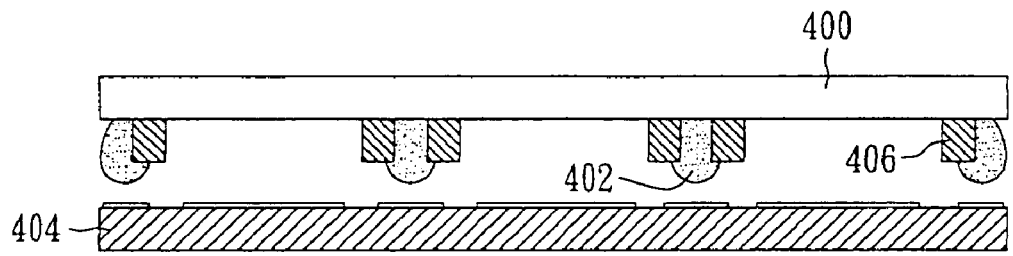
FIGS. 2(A)-2(E) are schematic cross-sectional views illustrating the WLCSP (Wafer Level Chip Scale Package) process according to prior art for making a packaged microdevice chip.
Figure 2B:
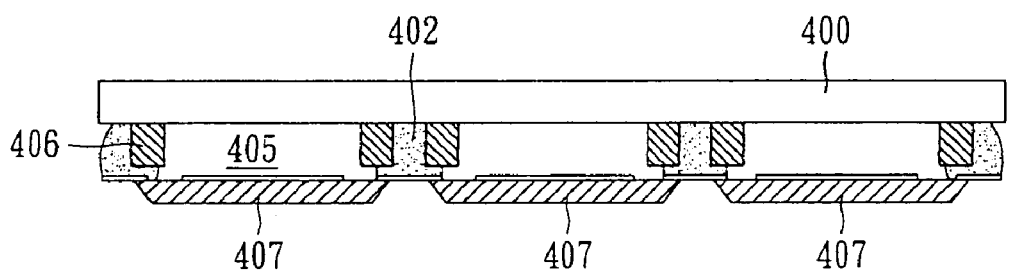
Figure 2C:
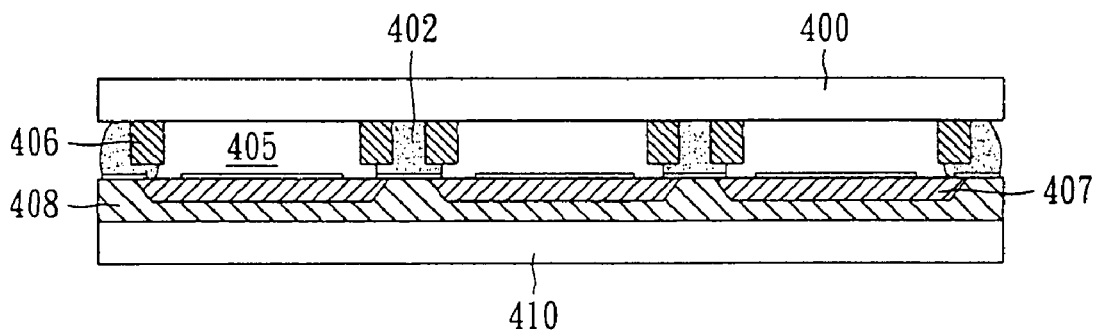
Figure 2D:
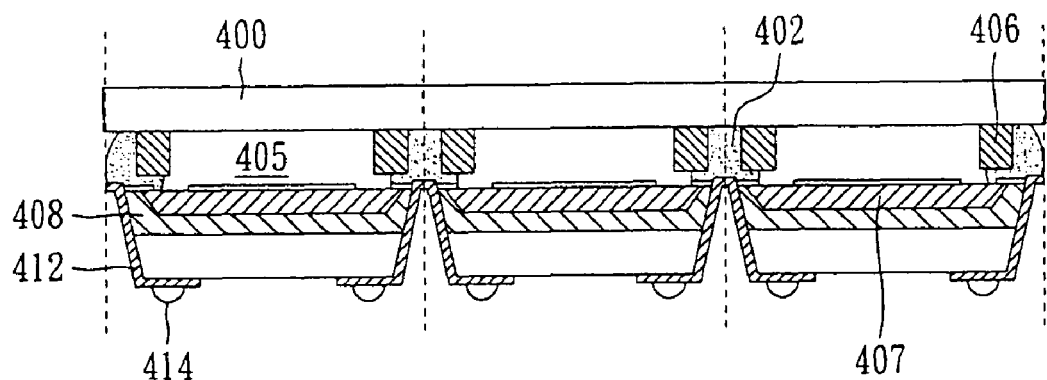
Figure 2E:
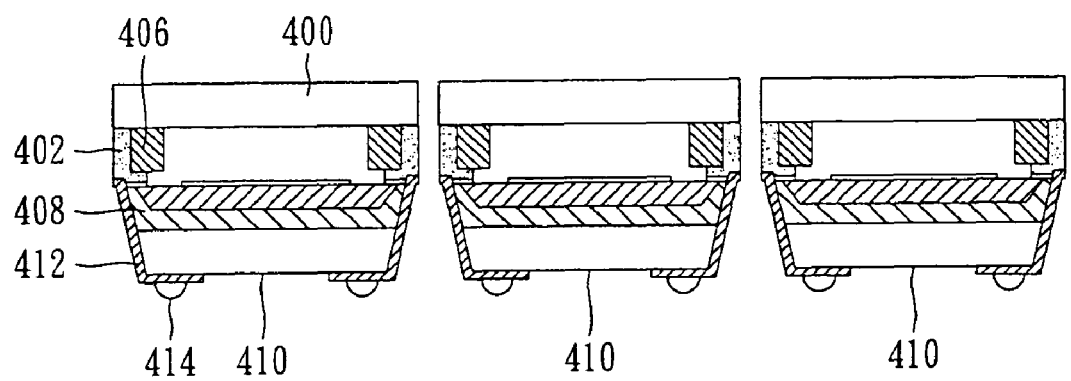

The present invention will now be described according to its preferred embodiments and drawings. The drawings are for illustrative purpose only; the thickness and width in the drawings are not drawn according to scale.

Figure 3A:
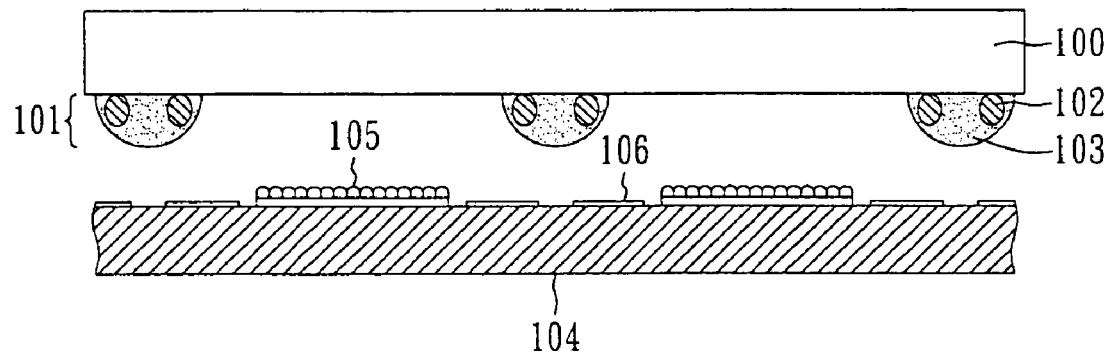
FIGS. 3(A)-3(C) are cross-sectional views of a preferred embodiment according to the present invention.
Figure 3B:
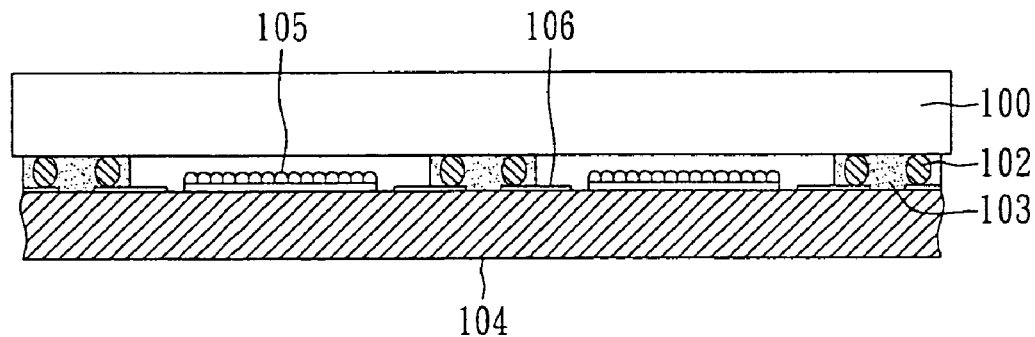
Figure 3C:
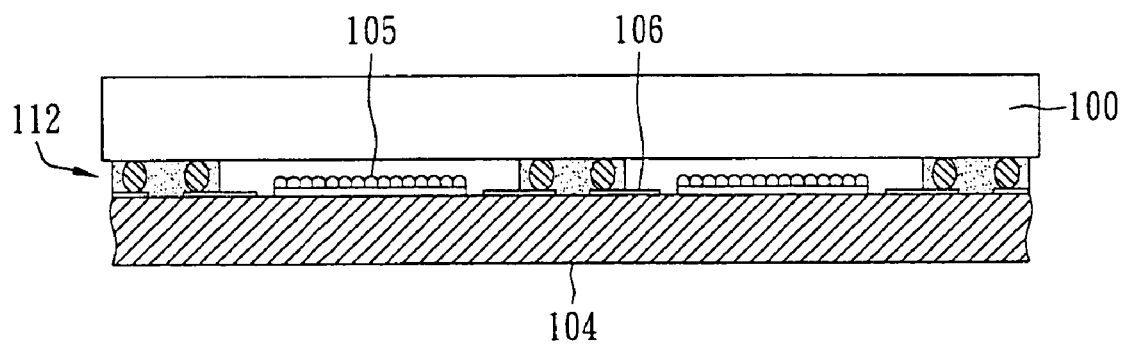

FIGS. 3(A)-(C) are cross-sectional views of a preferred embodiment according to the present invention, showing a WLCSP process for making a packaged optoelectronic device chip, such as an image sensor chip. Referring to FIG. 3(A), a device substrate 104 is provided, on which optoelectronic devices 105 such as image sensors have been made. A plurality of conductive pads 106 are provided adjacent to the devices 105. The size of the conductive pads may be designed according to circuit or process requirements. The devices 105 and the conductive pads 106 may be made onto the substrate by, e.g., a CMOS process. A transparent upper substrate 100, serving as an upper package layer, is placed over the device substrate 104. As shown in the drawing, there are a plurality of viscous protrusions 101 provided on the substrate 100. These viscous protrusions 101 are formed from a composite material which has not yet been transformed to a solid structure. The composite material includes an adhesive material 103 and a plurality of particles 102 dispersed in the adhesive material 103. The adhesive material 103 is preferably a photopolymer material curable under ultra-violate light. The particles 102 may be made of polymers or resins. In the drawings, the particles 102 are shown schematically to have a circular cross-section, but they may be of other shapes as well. More specifically, the particles 102 may be of a substantially spherical-shape, a substantially oval-shape, a substantially capsule-shape, or a substantially fiber shape. The composite material may be dispensed onto the substrate 100, or formed on the substrate 100 by screen printing.

Next, as seen from FIG. 3(B), the upper substrate 100 and the device substrate 104 are bonded together by means of the adhesive material 103. In this bonding step, the particles 102 serve to define a uniform distance between the two substrates across the wafer. (The target distance depends on the device design, but is typically in the range 10-50 µm for an image sensing device chip.) By virtue of the present invention, the distance variation is within the range of 1% to 2.5%, within the depth of focus of an associated optical system with FNo equal to, e.g., 2.8, for even an image sensor having a relatively small pixel size.

Referring to FIG. 3(C), in case the adhesive material 103 is a photopolymer material, a curing step is next taken so that the adhesive material 103 becomes solid, and the composite material becomes solid spacers 112. And in case the adhesive material 103 is made of another material, proper steps should be taken, such as drying, to solidify the adhesive material.

The preferred embodiment described above provides a uniform distance across the wafer, and therefore the optical characteristics such as the optical focus of the optoelectronic devices made on the wafer can be more accurately controlled. Moreover, the composite spacers 112 formed by this process are less vulnerable to stress and other issues, compared to the prior art laminated structure.

Figure 4A:
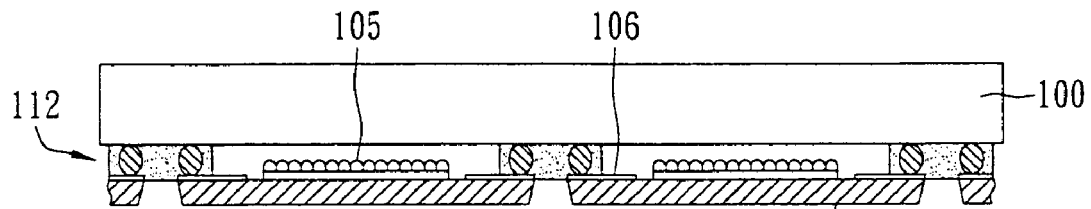
FIGS. 4(A)-4(D) are cross-sectional views showing one example of the process steps following FIG. 3(C), to complete a WLCSP process for making a packaged optoelectronic device chip.
Figure 4B:
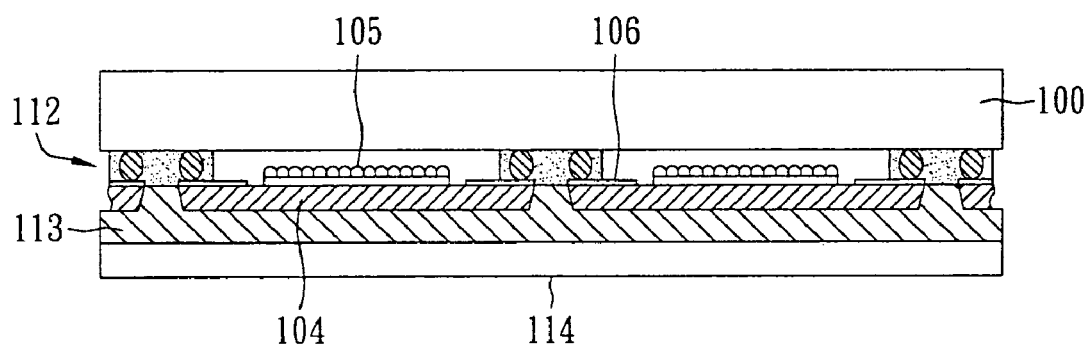
Figure 4C:
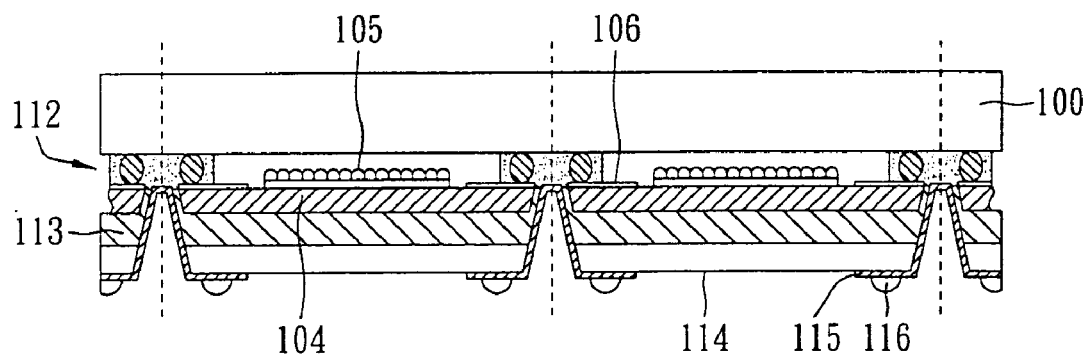
Figure 4D:
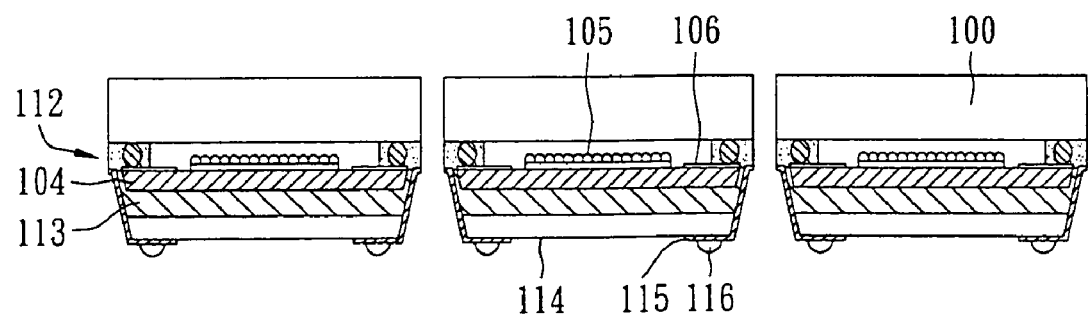

Following FIG. 3(C), there are several alternative approaches to complete the WLCSP process. One example is shown in FIGS. 4(A)-4(D). As shown in FIG. 4(A), after the curing step, the device substrate 104 is grinded, and notched by, e.g., an etch process. Following the notching step, as seen from FIG. 4(B), the bottom surface of the substrate 104 is coated with an adhesive material 113, and bonded with a bottom package layer 114. Next, as shown in FIG. 4(C), the bottom side of the wafer is again notched, e.g. by a cutting process, and electrical contacts 115 and bumps 116 are formed thereon. The wafer may then be diced along the dash lines to produce a plurality of packaged optoelectronic device chips as shown in FIG. 4(D).

Figure 5A:
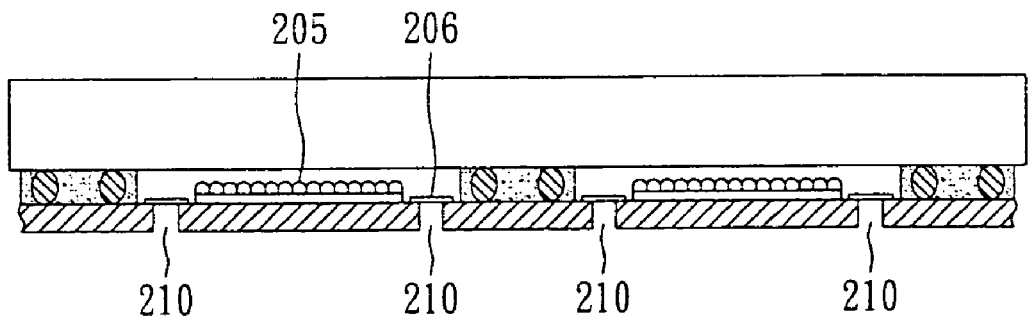
FIGS. 5(A)-5(C) are cross-sectional views showing another example of the process steps following FIG. 3(C), to complete a WLCSP process for making a packaged optoelectronic device chip.
Figure 5B:
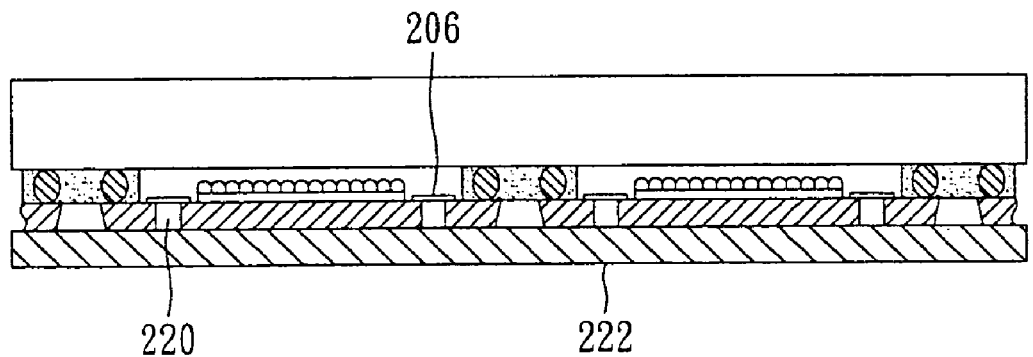
Figure 5C:
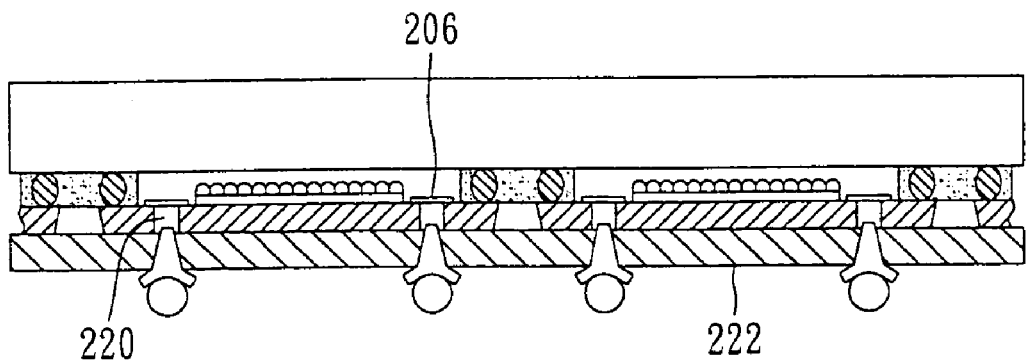

Alternatively, a through-hole interconnection process as shown in FIGS. 5(A)-5(C) may be employed instead of the foregoing process described with reference to FIGS. 4(A)-4(D). As seen from FIG. 5(A), a wafer having gone through the process steps as shown in 3(A)-3(C) is subject to a grinding step and an etch step, so that the device substrate 204 is etched to form through-holes 210 reaching the conductive pads 206 adjacent to the optoelectronic devices 205. In this through-hole interconnection process, the conductive pads 206 do not have to extend under the spacer. Next, referring to FIG. 5(B), a plating process is performed so that the bottom side of the conductive pads 206 and the sidewalls of the through-holes 210 are covered with a conductive layer 220. The conductive layer 220 is shown to completely fill the through-holes 210, but this is not necessarily required. It suffices if the conductive layer 220 covers the bottom side of the conductive pads 206 and at least a portion of the sidewalls of the through-holes 210. A passivation layer 222 is subsequently formed on the bottom side of the wafer. Thereafter, as an example and as seen in FIG. 5(C), an UBM (Under Bump Metal) forming process and a BGA forming process are sequentially performed. The process steps for forming UBM and BGA are well known to one skilled in this art, and thus the details thereof are omitted for simplicity. The final wafer having been formed with ball grid arrays thereon may be diced into multiple chips (not shown).

Figure 6A:
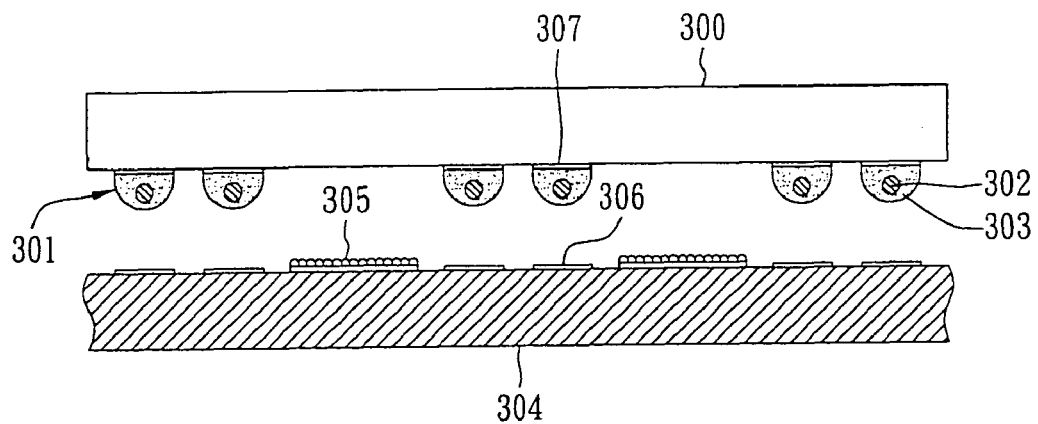
FIGS. 6(A)-6(E) are cross-sectional views of another preferred embodiment according to the present invention.

Referring to FIGS. 6(A)-6(E), another preferred embodiment according to the present invention is now described. In this embodiment, a device substrate 304 having optoelectronic devices 305 and conductive pads 306 formed thereon is provided. A transparent upper substrate 300, serving as an upper package layer, is placed over the device substrate 304. As shown in FIG. 6(A), the upper substrate 300 is also provided with a number of conductive pads 307 corresponding to the conductive pads 306. On each of the conductive pads 307, there is a viscous protrusion 301. These viscous protrusions 301 are formed from an anisotropic conductive adhesive material, which includes an insulating adhesive material 303 and a plurality of conductive particles 302 dispersed in the insulating adhesive material 303. The insulating adhesive material 303 may be made of thermoset epoxy materials or polymers. The conductive particles 302 may comprise a core made of polymers or resins, whose surface is coated with a conductive layer such as a metal layer. In the drawings, the conductive particles 302 are shown schematically to have a circular cross-section, but they may be of other shapes as well. More specifically, the particles 102 may be of a substantially spherical-shape, a substantially oval-shape, a substantially capsule-shape, or a substantially fiber shape. The anisotropic conductive adhesive material may be dispensed onto the substrate 300, or formed on the substrate 300 by screen printing.

Figure 6B:
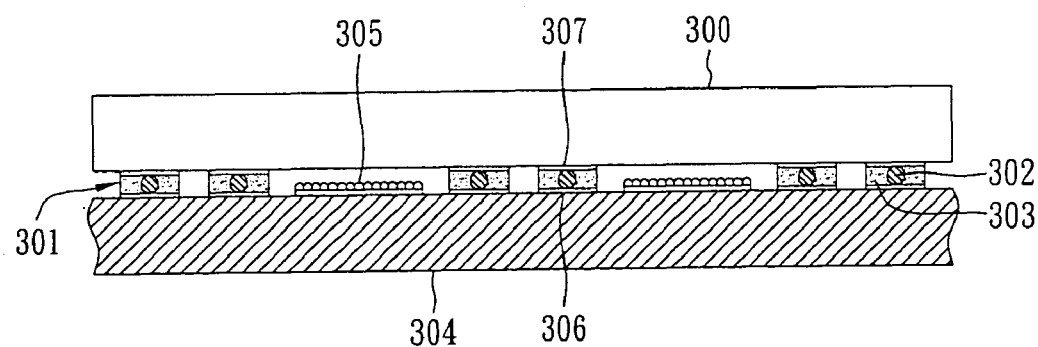

Next, as seen from FIG. 6(B), the upper substrate 300 and the device substrate 304 are bonded together by means of the insulating adhesive material 303. In this bonding step, the conductive particles 302 serve to define a uniform distance between the two substrates across the wafer. By this arrangement, the distance variation is controlled within the range of 1% to 2.5%. The conductive particles 302 also serve to electrically connect the conductive pads 36 and 307, but do not provide any lateral conduction, due to the anisotropic conductive characteristic of the anisotropic conductive adhesive material.

Figure 6C:
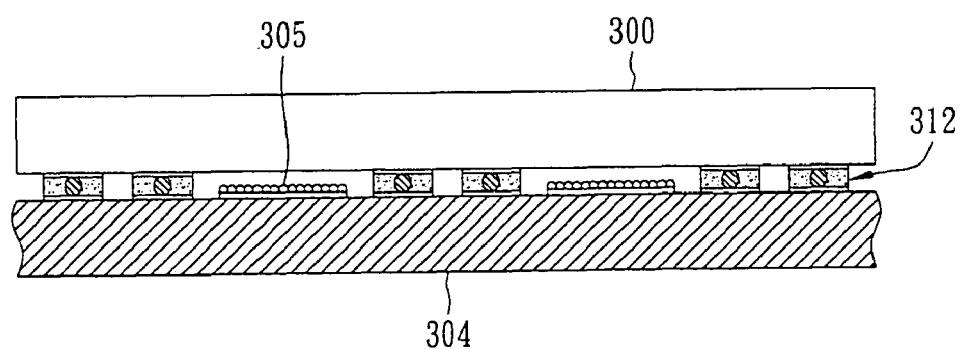

Referring to FIG. 6(C), the insulating adhesive material 303 is solidified so that the anisotropic conductive adhesive material becomes solid spacers 312. This may be done by, e.g., a thermal process, depending on what kind of insulating adhesive material 303 is used in the anisotropic conductive adhesive material.

Figure 6D:
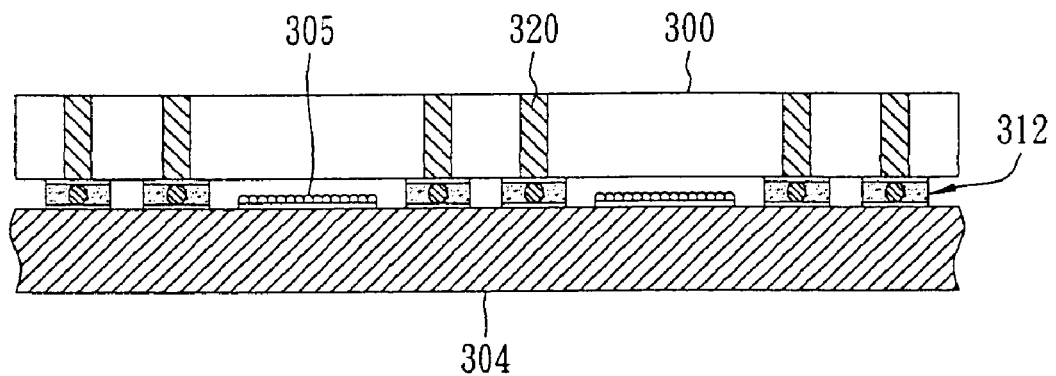

Next, as shown in FIG. 6(D), the upper substrate 300 is etched to form a plurality of through-holes, and a plating process is performed to cover the sidewalls and the bottom of the through-holes with a conductive layer 320. The conductive layer 320 is shown to completely fill the through-holes, but this is not necessarily required. It suffices if the conductive layer 320 covers the bottom and at least a portion of the sidewalls of the through-holes. Thereafter, in FIG. 6(E), gold or gold-tin pads 322 are formed on the top surface of the conductive layer 320.

Figure 6E:
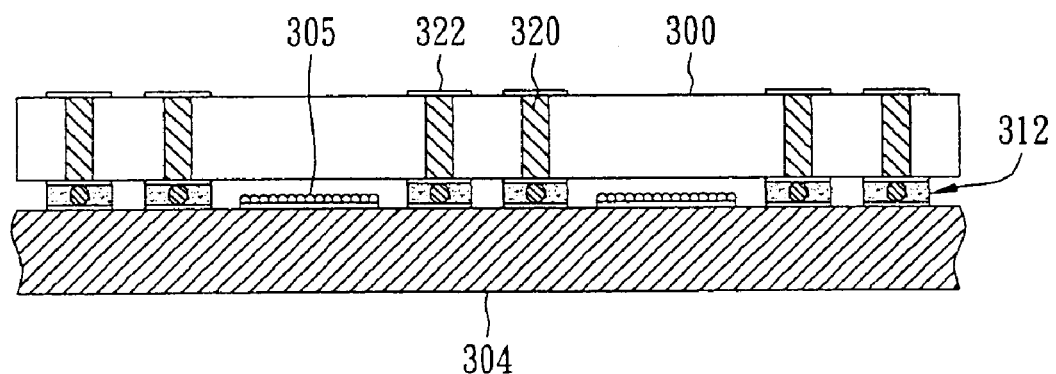
Figure 7:
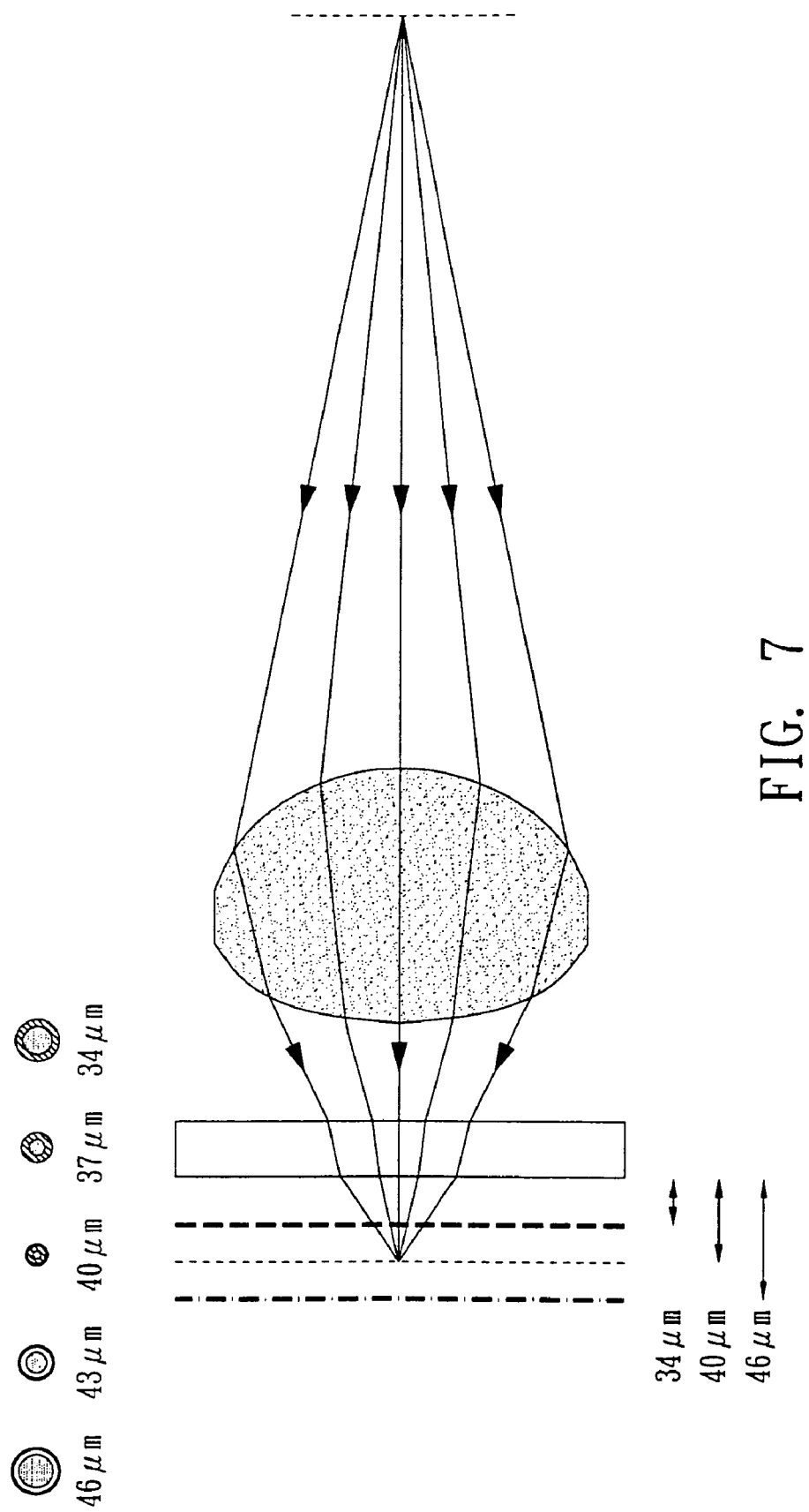
FIG. 7 shows an example of spot size variation due to non-uniform thickness.

After FIG. 6(E), conventional process steps such as a tap process may be taken, to attach a flexible printed circuit (FPC) onto the wafer. The FPC may be bonded with the pads 322 on the upper package layer 300 by means of ultra-sonic energy or infrared reflow, which are familiar to one skilled in this art.

The resultant wafer may be diced into multiple chips (not shown) to produce packaged optoelectronic device chips.

The preferred embodiment described above also provides a uniform distance across the wafer, for better controlling the optical characteristics of the optoelectronic devices. The spacers 312 formed by this process are also less vulnerable to stress and other issues. Moreover, this embodiment provides an alternative choice for electrical connection between an optoelectronic device with an external circuit, that is, from the top surface of an optoelectronic device chip.

The preferred embodiments of the invention have been described above to illustrate the spirit of the invention rather than to limit the scope of the invention. Substitutions and modifications may be made to steps, materials, structures and other aspects of the invention, as apparent to those skilled in the art. Therefore, all such substitutions and modifications are intended to be embraced within the scope of the invention as defined in the appended claims.

What is claimed is:

1. An optoelectronic device chip comprising:
a device substrate;
an optoelectronic device provided on said device substrate;
an upper package substrate; and
a composite spacer adjacent to said optoelectronic device and connecting said upper package layer with said device substrate,
wherein said composite spacer includes an adhesive material and a plurality of particles dispersed in said adhesive material,
wherein said particles comprise a core made of polymer or resins and the surface of said core is coated with a conductive layer.

2. The optoelectronic device chip as claimed in claim 1, wherein the distance between the bottom surface of said upper package layer substrate and the top surface of said device substrate is in a range of a target distance 10-50 µm plus or minus the depth of focus of an associated optical system.

3. The optoelectronic device chip as claimed in claim 1, wherein said adhesive material comprises a photopolymer material curable under ultra-violate light, and said particles are made of polymers or resins.

4. The optoelectronic device chip as claimed in claim 1, wherein said composite spacer is anisotropic conductive.

5. The optoelectronic device chip as claimed in claim 4, wherein adhesive material is an insulating adhesive material, and said particles are conductive.

6. The optoelectronic device chip as claimed in claim 4, further comprising a conductive pad at the bottom surface of said upper package layer substrate.

7. The optoelectronic device chip as claimed in claim 6, further comprising a conductive layer at least within said upper package layer substrate and connecting with said conductive pad.

* * * * *